(12) United States Patent
Mukherjee et al.

(10) Patent No.: US 6,600,229 B2
(45) Date of Patent: Jul. 29, 2003

(54) PLANARIZERS FOR SPIN ETCH PLANARIZATION OF ELECTRONIC COMPONENTS

(75) Inventors: Shyama Mukherjee, Santa Clara, CA (US); Joseph Levert, Vista, CA (US); Donald DeBear, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/847,766

(22) Filed: May 1, 2001

(65) Prior Publication Data

US 2002/0117758 A1 Aug. 29, 2002

Related U.S. Application Data

(63) Continuation-in-part of application No. 09/768,439, filed on Jan. 23, 2001.

(51) Int. Cl.$^7$ .................................................. H01L 23/48
(52) U.S. Cl. .................... 257/762; 257/752; 438/625; 438/626; 438/627; 438/645; 438/687
(58) Field of Search ................ 257/762, 763, 257/766, 752; 438/678, 683, 685, 622, 297, 584, 758, 633, 625–628, 645, 687, 648, 692

(56) References Cited

U.S. PATENT DOCUMENTS

| | | | | |
|---|---|---|---|---|
| 5,098,860 A | * | 3/1992 | Chakravorty et al. | 438/628 |
| 5,436,504 A | * | 7/1995 | Chakravorty et al. | 257/758 |
| 5,744,399 A | * | 4/1998 | Rostoker et al. | 438/622 |
| 5,786,632 A | * | 7/1998 | Farnworth et al. | 257/701 |
| 5,969,422 A | * | 10/1999 | Ting et al. | 257/762 |
| 6,057,223 A | * | 5/2000 | Lanford et al. | 438/618 |
| 6,066,892 A | * | 5/2000 | Ding et al. | 257/751 |
| 6,080,656 A | * | 6/2000 | Shih et al. | 438/626 |
| 6,083,822 A | * | 7/2000 | Lee | 438/624 |
| 6,096,649 A | * | 8/2000 | Jang | 438/687 |
| 6,127,258 A | * | 10/2000 | Watanabe et al. | 438/625 |
| 6,146,991 A | | 11/2000 | Cheng et al. | 438/622 |
| 6,150,269 A | * | 11/2000 | Roy | 438/687 |
| 6,159,842 A | * | 12/2000 | Chang et al. | 438/622 |
| 6,265,321 B1 | * | 7/2001 | Chooi et al. | 438/725 |
| 6,313,028 B2 | * | 11/2001 | Huang et al. | 438/637 |
| 6,351,039 B1 | * | 2/2002 | Jin et al. | 257/758 |
| 6,352,921 B1 | * | 3/2002 | Han et al. | 438/638 |
| 6,358,842 B1 | * | 3/2002 | Zhou et al. | 438/633 |
| 6,417,093 B1 | * | 7/2002 | Xie et al. | 438/626 |

OTHER PUBLICATIONS

J. Levert, S.Mukherjee, D. DeBear, and M.Fury entitled, "A Novel Spin–Etch Planarization Process for Dual–Damascene Copper Interconnects", Oct. 19, 1999, 12 pages.
J. Levert, S. Mukherjee, D. DeBear entitled, "SEMI Technology Symposium 99 Proceedings", Dec. 1999, 10 pages.
PCT Written Opinion.

* cited by examiner

Primary Examiner—David Nelms
Assistant Examiner—Andy Huynh
(74) Attorney, Agent, or Firm—Riordan & McKinzie; Sandra P. Thompson

(57) ABSTRACT

An electronic component contemplated comprises a) a substrate layer, b) a dielectric layer coupled to the substrate layer, c) a barrier layer coupled to the dielectric layer, d) a conductive layer coupled to the barrier layer, and e) a protective layer coupled to the conductive layer. The electronic component contemplated herein can be produced by a) providing a substrate; b) coupling a dielectric layer to the substrate; c) coupling a barrier layer to the dielectric layer; d) coupling a conductive layer to the barrier layer; and e) coupling a protective layer to the conductive layer. The protective layer may then be cured to a desirable hardness. A method of planarizing a conductive surface of an electronic component may comprise a) introducing or coupling a protective layer onto a conductive layer; b) dispersing the protective layer across the conductive layer; c) curing the protective layer; d) introducing an etching solution onto the conductive layer; and e) etching the conductive surface to substantial planarity.

11 Claims, 4 Drawing Sheets

PLANARIZERS FOR SPIN ETCH PLANARIZATION OF ELECTRONIC COMPONENTS

This application is a continuation in part of U.S. Utility Application entitled "Viscous Protective Overlayers for Planarization" application Ser. No. 09/768,439, filed Jan. 23, 2001, incorporated herein by reference in its entirety.

FIELD OF THE INVENTION

The field of the invention is planarization and electronic components.

BACKGROUND OF THE INVENTION

Electronic components are used in ever increasing numbers of consumer and commercial electronic products. Examples of some of these consumer and commercial products are televisions, computers, cell phones pagers, a palm-type organizer, portable radios, car stereos, or remote controls. As the demand for these consumer and commercial electronics increases, there is also a demand for those same products to become smaller and more portable for the consumers and businesses.

As a result of the size decrease in these products, the components that comprise the products must also become smaller. Examples of some of those components that need to be reduced in size or scaled down are printed circuit or wiring boards, resistors, wiring, keyboards, touch pads, and chip packaging.

When electronic components are reduced in size or scaled down, any defects that are present in the larger components are going to be exaggerated in the scaled down components. Thus, the defects that are present or could be present in the larger component should be identified and corrected, if possible, before the component is scaled down for the smaller electronic products.

In order to identify and correct defects in electronic components, the components, the materials used and the manufacturing processes for making those components should be broken down and analyzed. Electronic components are composed, in some cases, of layers of materials, such as metals, polymers, metal alloys, inorganic materials or organometallic materials. The layers of materials are often thin (on the order of less than a millimeter in thickness) and delicate.

As integrated circuits (ICs) become smaller and more advanced as to performance, it is imperative to increase the density of the components on the wafer, while increasing the speed at which the integrated circuit performs its functions. Increasing component density requires, among other things, decreasing the size of the conducting trenches and vias ("interconnects") on the wafer. However, decreasing the cross-section of the current-carrying conductor increases the electrical resistance for the same conducting material, which degrades circuit performance and increases heating of the interconnects. Thus, the materials and methods for producing these integrated circuits need to be evaluated and potentially replaced by better performing materials and methods of production.

Conventional IC technology uses tungsten (W) and aluminum (Al) interconnects and/or alloys containing these materials. Both tungsten and aluminum, and alloys thereof, have adequate electrical conductivity for use in electronic components, but future generations of ICs will preferably make use of higher conductivity materials, such as copper (Cu).

Copper has several advantages that make it an ideal material for use in electronic components: a) copper has the highest conductivity of any metal except pure silver, b) copper is readily solderable, c) copper has excellent corrosion resistance in natural environments. Copper alloys are also considered excellent alloys for use in electronic components. Harper, Charles A. ed., *Electronic Packaging and Interconnect Handbook,* Second Edition, McGraw-Hill (New York), 1997. Copper also has the disadvantage of being diffusive—diffusing easily and widely through other materials typically used in the fabrication of ICs, seriously degrading IC performance. To control copper diffusion into the dielectric material, especially if the dielectric material is porous, barrier materials or layers may be deposited prior to copper deposition (or deposition of any "copper-like" conductive material) to hinder diffusion of copper or another conductive material into the surrounding material or dielectric material.

Once the layered material is prepared, it is planarized to provide a flat, smooth surface that can be patterned and etched with the accuracy required of modern IC components. Contact planarization, such as Chemical Mechanical Planarization (CMP), is known in the art and fully described in textbooks, such as *Chemical Mechanical Planarization of Microelectronic Materials,* by Joseph M. Steigerwald, Shyam P. Murarka and Ronald J. Gutman (1997). CMP makes use of a polishing pad brought into mechanical contact with a wafer to be planarized with an abrasive slurry interposed between the polishing pad and the wafer. Relative motion (typically rotation) of the polishing pad with respect to the wafer leads to polishing of the wafer through mechanical abrasion. Chemical etching of the wafer then takes place through application of an etching solution to the wafer.

Non-contact planarization, such as Spin Etch Planarization (SEP), is another method of planarization whereby there is no mechanical abrasion of the surface of the wafer. The planarization process takes place purely through application of appropriate chemicals. The process of Spin Etch Planarization is described in U.S. patent application Ser. No. 09/356,487 and is incorporated by reference herein in its entirety. Aspects of non-contact planarization and Spin Etch Planarization have been reported and discussed in the following publications: J. Levert, S. Mukherjee and D. DeBear, "Spin Etch Planarization Process for Copper Damascene Interconnects" in *Proceedings of SEMI Technology Symposium* 99, Dec. 1–3, 1999, pp. 4–73 to 4–82; J. Levert, S. Mukherjee, D. DeBear, and M. Fury, "A Novel Spin-Etch Planarization Process for Dual-Damascene Copper Interconnects" in *Electrochemical Society Conference,* October 1999, p. 162 ff; and Shyama P. Mukherjee, Joseph A. Levert, and Donald S. DeBear, "Planarization of Copper Damascene Interconnects by Spin-Etch Process: A Chemical Approach" in *MRS Spring Meeting, San Francisco, Calif., Apr.* 27, 2000 and Donald S. DeBear, Joseph A. Levert, and Shyama Mukherjee, "Spin Etch Planarization for Dual Damascene Interconnect Structures" in *Solid State Technology,* March 2000, 43(3), pp 53–60 including all of the references cited in all of the foregoing.

Non-contact planarization suffers from a considerable drawback—surface defects and imperfections are influenced by the planarization process and portions of the conductive layer in the imperfections or defect are undesirably removed resulting in a dish-like geometry. Dishing is a common and undesirable side effect of removing the field region conductive layer and the barrier layer overlying the field region. In other words, the polishing or planarization procedure wears down the tops of the imperfections but also can wear down the crevices of the imperfections, which results in a surface that contains constant imperfections despite applied planarization techniques.

Therefore, there is a need to improve planarization techniques used in the fabrication of integrated circuits, such that imperfections and surface defects in the conductive layers are not removed or are minimally removed as the surface is being planarized. Further, it is important that the improved planarization techniques do not hinder or disrupt the process of build-up of the integrated circuit.

SUMMARY OF THE INVENTION

An electronic component contemplated comprises a) a substrate layer, b) a dielectric material or layer coupled to the substrate layer, c) a barrier layer coupled to the dielectric material or layer, d) a conductive layer coupled to the barrier layer, and e) a protective layer coupled to the conductive layer.

The electronic component contemplated herein can be produced by a) providing a substrate; b) coupling a dielectric layer to the substrate; c) coupling a barrier layer to the dielectric material or layer; d) coupling a conductive layer to the barrier layer; and e) coupling a protective layer, which planarizers or can be planarized, to the conductive layer. The protective layer may then be cured to a desirable hardness.

A method of planarizing a conductive surface of an electronic component may comprise a) introducing or coupling a protective layer onto a conductive layer; b) dispersing and planarizing the protective layer across the conductive layer; c) curing the protective layer; d) introducing an etching solution onto the conductive layer; and e) etching the conductive surface to substantial planarity.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
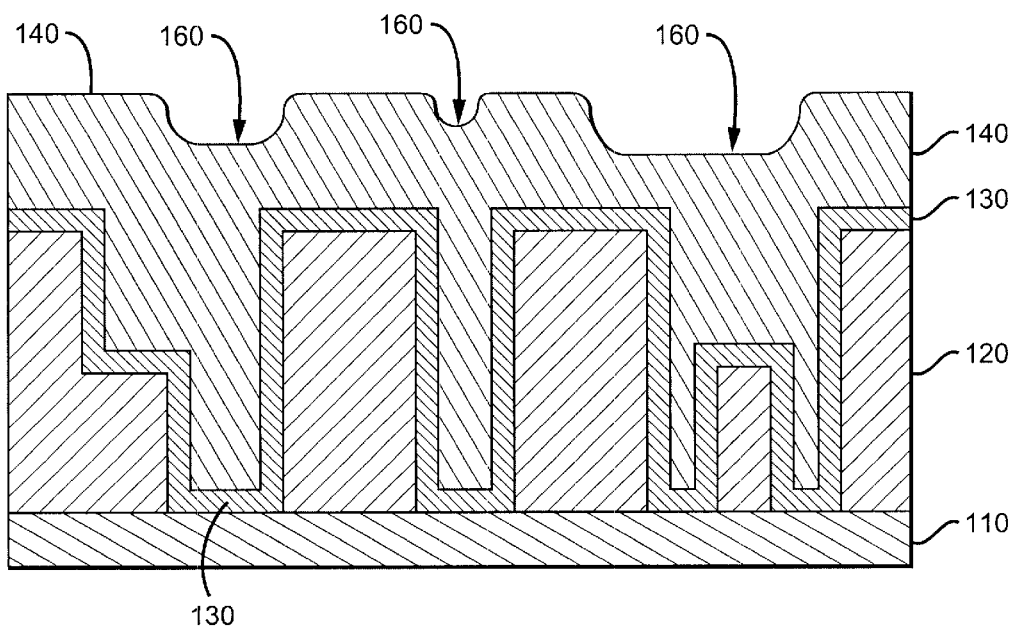
FIG. 1 is a schematic diagram of a conventional damascene metal interconnection structure before planarization.

Prior art FIG. 1 shows a schematic diagram of a conventional damascene metal interconnection structure before planarization comprising a) a substrate layer 110, b) a dielectric material or layer 120 coupled to the substrate layer 110, c) a barrier layer 130 coupled to the dielectric layer 120 and d) a conductive layer 140 coupled to the barrier layer 130. This type of conventional interconnection structure might be found in several types of typical electronic components.

The dielectric material or layer 120 in FIG. 1 is usually patterned by techniques such as photolithography, and plasma etching. (Note: the terms "dielectric material" and "dielectric layer" are intended to be used interchangeably throughout this disclosure). The barrier layer 130 is typically deposited on the patterned dielectric followed by deposition of the conductive layer 140. Conventional barrier layers 130 comprise tantalum/tantalum nitride (Ta/TaN) and are used with copper conductive layers 140.

The conductive layer in these conventional components contains imperfections that can be significant problems when building a layered component. FIG. 1 shows what imperfections 160 might look like on the surface of the conductive layer 140. Surface topography imperfections are created because of the conformal application of the conductive layer to the surface topography of trenches and vias formed by the underlying barrier material and dielectric material.

Figure 2:
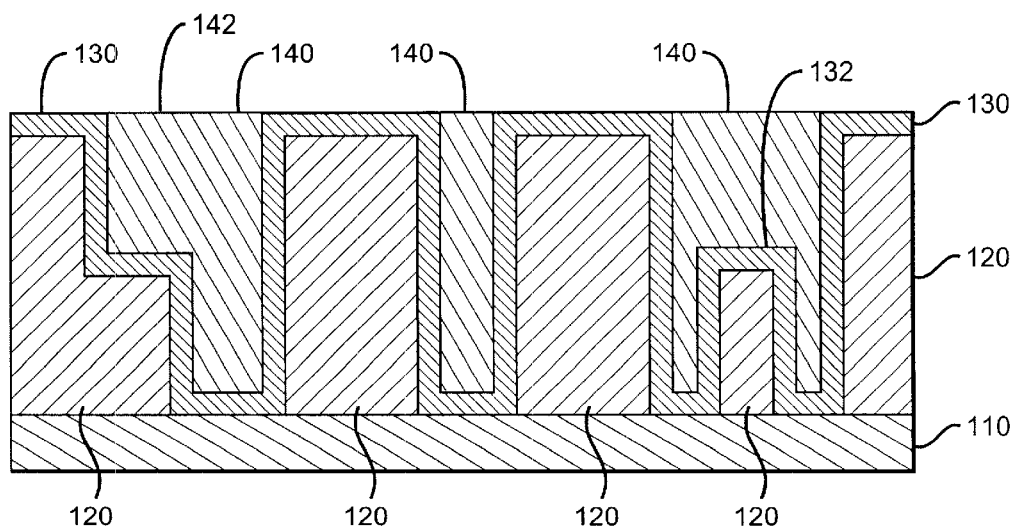
FIG. 2 is a schematic diagram of a conventional component where the surface is polished and all imperfections are removed.

Ideally, to correct the imperfections 160 in a conventional electronic component, the surface of the conductive layer is planarized or polished by some means, such as mechanical polishing, chemical polishing, or chemical mechanical polishing. FIG. 2 shows an ideal situation where the surface is polished and all imperfections are removed. Perfect planarization removes copper until the upper or elevated surface 142 of the conductive layer 140 is co-planar with the upper surface 132 of the barrier layer 130 on the field region, and at that point, etching is halted. Ideal planarization also removes the barrier layer 130 at the same rate as the conductive layer 140—substantially a 1 to 1 selectivity.

Figure 3:
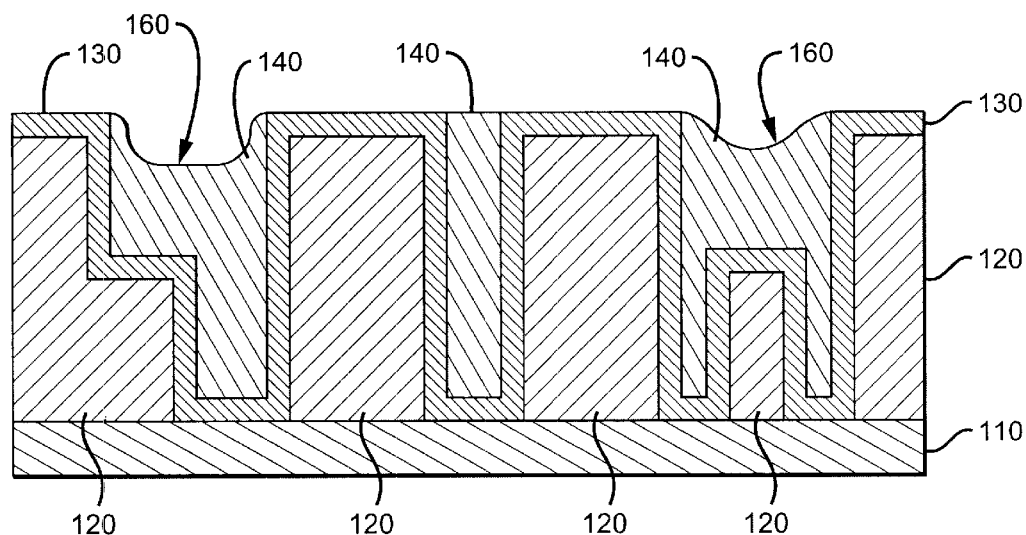
FIG. 3 is a schematic diagram showing a conventional layered material.

Realistically, however, as the surface is being planarized, the imperfections 160 in the conductive layer 140 are influenced by the planarization process and portions of the conductive layer 140 in the imperfections 160 are undesirably removed resulting in a dish-like geometry, which is termed "dishing". The imperfections 160 can be created through dishing and by surface topography defects. Dishing is a result of a non-efficient planarization process during removal of excess conductive material. (See FIG. 3). Dishing is a common and undesirable side-effect of removing the field region conductive layer 140 and the barrier layer 130 overlying the field region. In other words, the polishing or planarization procedure wears down the tops of the imperfections but also can wear down the crevices of the imperfections. Further, the etchants being used frequently do not remove the barrier layer 130 at the same rate as the conductive layer 140, which contributes to additional formation of surface defects.

Figure 4:
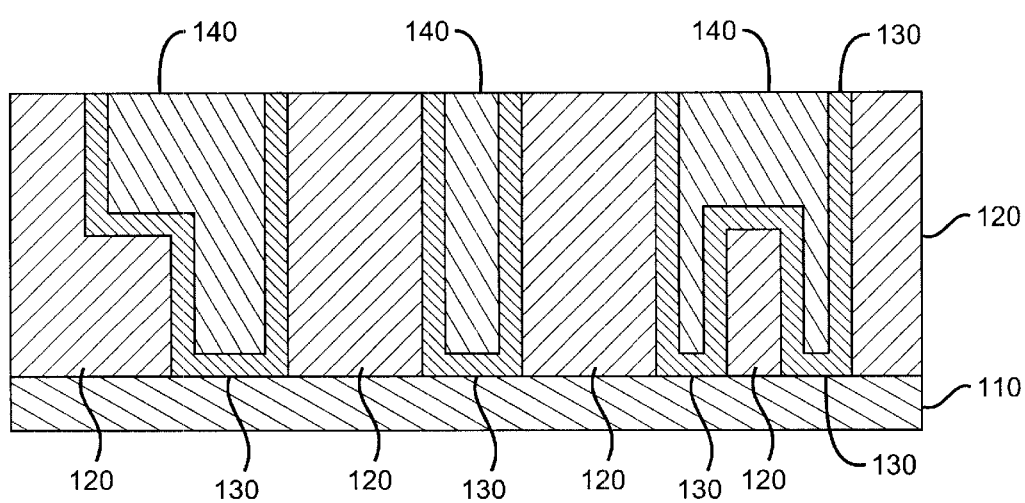
FIG. 4 is a schematic diagram of a conventional layered material where the barrier layer is removed after its exposure by subsequent planarization along with removal of sufficient conductive material or layer to retain coplanarity of the metal-filled feature and dielectric.

FIG. 4 shows another conventional layered material where the barrier layer 130 is removed after its exposure by subsequent planarization along with removal of sufficient conductive material or layer 140 to retain coplanarity of the metal-filled feature and dielectric layer 120. If the planarization procedure achieves substantially a 1:1 selectivity in the removal of barrier material 130 and conductive layer 140, the direct planarization may be accomplished in one step. However, this is quite an idealistic achievement for any planarization process. Any practical planarization process, such as the one disclosed herein, must take into consideration the effects of dishing and surface topography defects.

Figure 5:
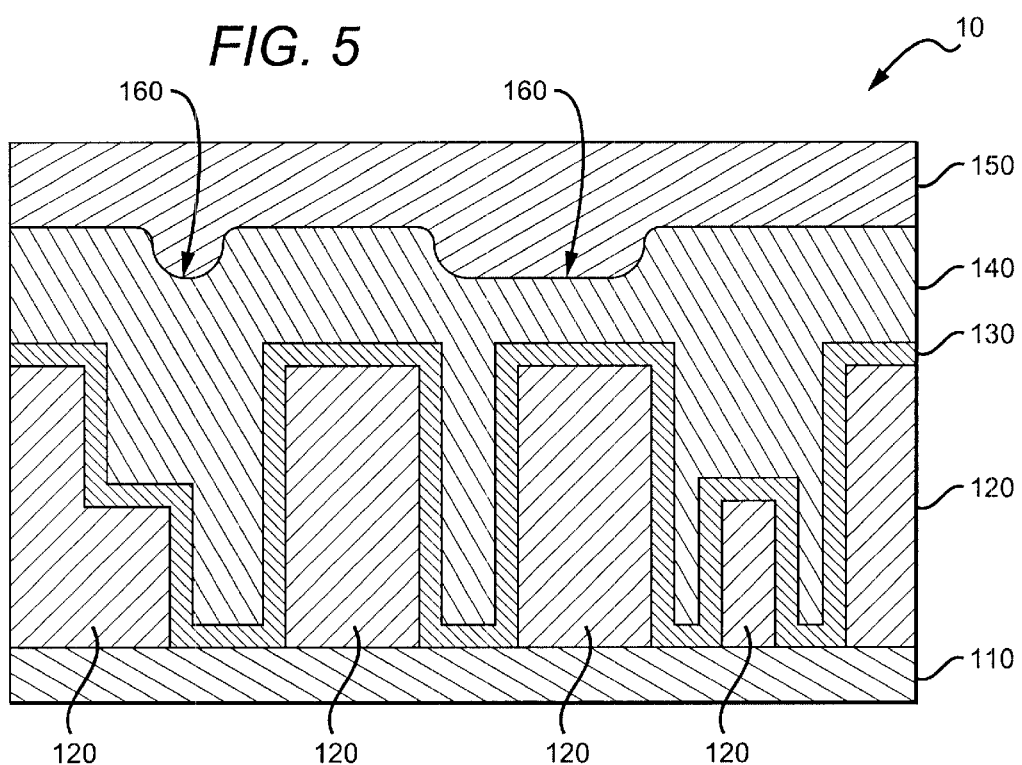
FIG. 5 is a schematic diagram of a contemplated embodiment of the present invention.

FIG. 5 shows a preferred embodiment of an electronic component 10 contemplated herein comprising a) a substrate layer 110, b) a dielectric layer 120 coupled to the substrate layer 110, c) a barrier layer 130 coupled to the dielectric layer 120, d) a conductive layer 140 coupled to the barrier layer 130, and e) a protective layer 150 coupled to the conductive layer 140.

As used herein, the term "electronic component" means that component that is part of an electronic device, such as a circuit board, a capacitor, a resistor, chip packaging, a layered integrated circuit or an inductor. It is preferred that the electronic component 10 comprises a circuit board or layered integrated circuit.

The substrate layer 110, in this embodiment, is designed to a) be functional within the electronic component 10 and b) provide support to the dielectric layer 120. The substrate can comprise virtually any substance upon which a compound or dielectric material can be deposited, as well as repeating layers like the layered structures contemplated herein. For example, contemplated substrates include metals and non-metals, conductors and non-conductors, flexible and inflexible materials, absorbent and non-absorbent materials, flat and curved materials, textured and non-textured materials, and both large and small objects. Particularly preferred substrates are circuit boards, paper, glass, and metal objects. In preferred embodiments, the substrate comprises silicon, silicon-germanium, gallium-arsenide, indium phosphide, quartz, or sapphire wafer, with the silicon wafer being the most preferred.

The phrase "dielectric constant" means a dielectric constant evaluated at 1 MHz to 2 GHz for a material, unless otherwise inconsistent with context. It is contemplated that the value of the dielectric constant of the dielectric layer 120 is less than 3.0. In a preferred embodiment, the value of the dielectric constant is less than 2.5, and in still more preferred embodiments, the value of the dielectric constant is less than 2.0.

The dielectric material or dielectric layer 120 (both the terms "dielectric material" and "dielectric layer" can be used interchangeably) can be designed to satisfy several design goals, such as providing support for the substrate layer 110 and the barrier layer 130, while maintaining a relatively low dielectric constant. The dielectric layer 120 can be coupled to the substrate layer 110 by any suitable process, such as use of an adhesive, hydrogen bonding, electrostatic interactions, Van der Waals forces, and coulombic interactions. The dielectric material 120 may also either be porous or non-porous depending on the structural, electrical, and dielectric needs of the component.

Figure 6:
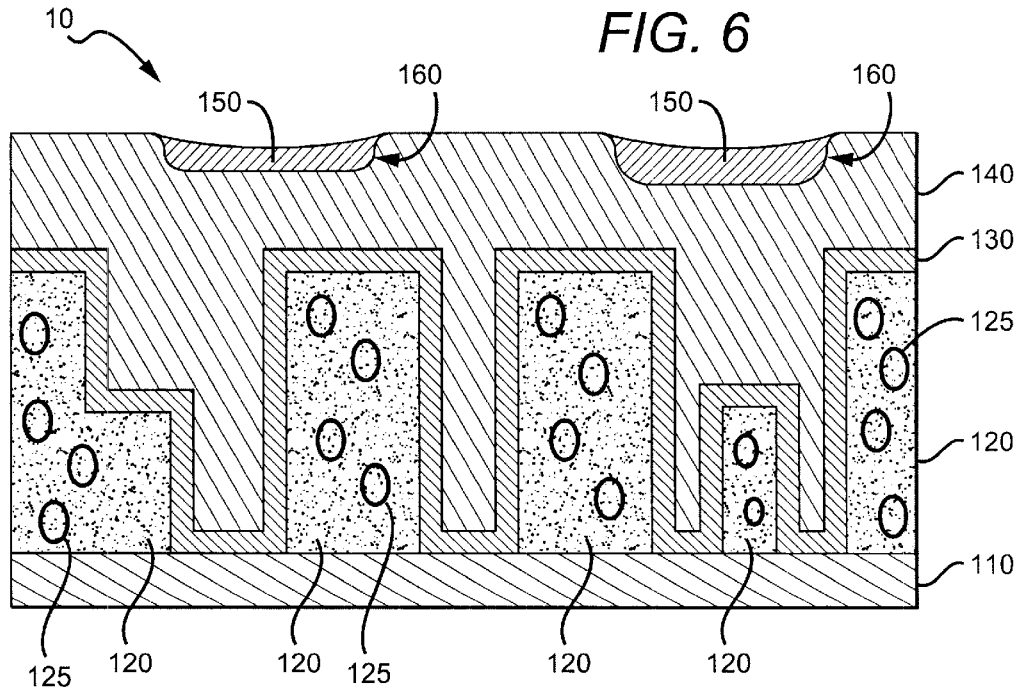
FIG. 6 is a schematic diagram of a contemplated embodiment of the present invention.

Porous dielectric layers 120, as shown incorporated into an electronic component 10 in FIG. 6, are dielectric layers that contain both a solid component, such as an organic, inorganic or organometallic compound, and a plurality of voids. As used herein, the word "void" means a volume in which a mass is replaced with a gas. The composition of the gas is generally not critical, and appropriate gases include relatively pure gases and mixtures thereof, including air. Voids 125 are typically spherical, but may alternatively or additionally have any suitable shape, including tubular, lamellar, discoidal, or other shapes. It is also contemplated that voids 125 may have any appropriate diameter. It is further contemplated that at least some voids 125 may connect with adjacent voids 125 to create a structure with a significant amount of connected or "open" porosity. Voids 125 preferably have a mean diameter of less than 1 micrometer, and more preferably have a mean diameter of less than 100 nanometers, and still more preferably have a mean diameter of less than 10 nanometers. It is further contemplated that voids 125 may be uniformly or randomly dispersed within the dielectric layer 120. In a preferred embodiment, voids 125 are uniformly dispersed within the dielectric layer 120.

The dielectric material or layer 120 can be composed of inorganic, organic, or organometallic compounds, as well as mixtures of these materials. Examples of contemplated inorganic compounds are silicates, aluminates and compounds containing transition metals. Examples of organic compounds include polyarylene ether, polyimides and polyesters. Examples of contemplated organometallic compounds include poly(dimethylsiloxane), poly(vinylsiloxane) and poly(trifluoropropylsiloxane).

The dielectric material 120 may also include substantially polymeric material, substantially monomeric material or a mixture of both polymers and monomers depending on the desired final dielectric composition, desired electrical properties, and desired use of the dielectric material. It is further contemplated that the dielectric material 120 may be composed of amorphous, cross-linked, crystalline, or branched polymers. Preferred components of the dielectric material 120 are inorganic polymers. More preferred components of the dielectric material 120 are inorganic, cross-linked polymers because of the increased durability and polymer strength. The term "crosslinking" refers to a process in which at least two molecules, or two portions of a long molecule, are joined together by a chemical interaction. Such interactions may occur in many different ways, including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

Contemplated polymers may also comprise a wide range of functional or structural moieties, including aromatic systems, and halogenated groups. Furthermore, appropriate polymers may have many configurations, including a homopolymer, and a heteropolymer. Moreover, alternative polymers may have various forms, such as linear, branched, super-branched, or three-dimensional. The molecular weight of contemplated polymers spans a wide range, typically between 400 Dalton and 400000 Dalton or more. In a preferred embodiment, the dielectric material 120 comprises inorganic molecules or polymers. In a most preferred embodiment, the dielectric material 120 comprises a polysilicate.

The dielectric material 120 may additionally or alternately comprise monomers in order to meet certain design goals and/or structural requirements. As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "blockpolymers". Monomers may belong to various chemical classes of molecules including organometallic or inorganic molecules. Examples of contemplated organometallic monomers are octamethylcyclotetrasiloxane, methylphenylcyclotetrasiloxane, hexanethyldisilazane, and triethyoxysilane. Examples of contemplated inorganic monomers include tetraethoxysilane or aluminum isopropoxide. The molecular weight of monomers may vary greatly between about 40 Dalton and 20000 Dalton.

However, especially when monomers comprise repetitive building blocks, monomers may have even higher molecular weights. Monomers may also include additional groups, such as groups used for crosslinking.

In further alternative embodiments, many other silicon-containing materials are contemplated as components of the dielectric material 120, including colloidal silica, fumed silica, siloxanes, silsequioxanes, and sol-gel-derived monosize silica. Appropriate silicon-containing compounds preferably have a size of below 100 nm, more preferably below 10 nm and most preferably below 5 nm. It is also contemplated that the dielectric material 120 may comprise materials other than silicon-containing materials, including organic, organometallic or partially-inorganic materials, provided that such materials can be dissolved at least in part in a solvent that does not dissolve the dielectric material 120. For example, appropriate organic materials are polystyrene, and polyvinyl chloride. Contemplated organometallic materials are, for example, octamethylcyclotetrasiloxane. Contemplated inorganic materials are, for example, $KNO_3$.

Alternatively, the organic and inorganic compounds can be selected such that the inorganic component can be dissolved at least in part by a solution that does not dissolve the organic component of the dielectric material 120. For example, colloidal silica can be dissolved by a dilute HF solution without dissolving an organic polymer such as polyarylene ether.

In some preferred embodiments, dielectric material 120 may comprise dielectric materials contemplated, produced or disclosed by Honeywell, Inc. including, but not limited to: a) FLARE (poly(arylene ether)), such as those compounds disclosed in issued patents U.S. Pat. No. 5,959,157, U.S. Pat. No. 5,986,045, U.S. Pat. No. 6,124,421, U.S. Pat. No. 6,156,812, U.S. Pat. No. 6,172,128, U.S. Pat. No. 6,171,687, U.S. Pat. No. 6,214,746, and pending application Ser. Nos. 09/197478, 09/538276, 09/544504, 09/741634, 09/651396, 09/545058, 09/587851, 09/618945, 09/619237, 09/792606, b) GX3 (adamantane-based materials), such as those shown in pending application Ser. No. 09/545058, c) nanoporous silica materials and silica-based compounds, such as those compounds disclosed in issued patents U.S. Pat. No. 6,022,812, U.S. Pat. No. 6,037,275, U.S. Pat. No. 6,042,994, U.S. Pat. No. 6,048,804, U.S. Pat. No. 6,090,448, U.S. Pat. No. 6,126,733, U.S. Pat. No. 6,140,254, U.S. Pat. No. 6,204,202, U.S. Pat. No. 6,208,014, and pending application Ser. Nos. 09/046474, 09/046473, 09/111084, 09/360131, 09/378705, 09/234609, 09/379866, 09/141287, 09/379484, 09/392413, 09/549659, 09/488075, 09/566287, and 09/214219 all of which are incorporated by reference herein in their entirety.

A barrier layer 130 is coupled to the dielectric material 120 by any suitable process, such as use of an adhesive, hydrogen bonding, electrostatic interactions, Van der Waals forces, and coulombic interactions. The barrier layer 130 may comprise any suitable material or materials that is capable of meeting several and sometimes conflicting design goals, such as a) successfully protecting the dielectric layer 120 from any diffusion of the conductive layer 140, b) acting as an "etch stop"—which indicates the end point of the conductive field planarization step, c) reacting to etching chemicals in a 1 to 1 selectivity rate with the conductive layer materials 140, and/or d) not reacting to the etching chemicals at all, such that when the etching chemicals reach the barrier layer 130 none of the barrier layer 130 is removed. Contemplated barrier layers 130 comprise tantalum, tantalum nitride, titanium, titanium nitride, tungsten-nitride, tungsten cobalt phosphorus, and nickel. In preferred embodiments, the barrier layer 130 comprises tantalum, tantalum nitride, or tantalum/tantalum nitride (Ta/TaN) stacks.

A conductive layer 140 is applied to and coupled to the barrier layer 130 by any suitable deposition method, such as electrodeposition, chemical vapor deposition (CVD), plasma vapor deposition (PVD), and fill deposition. Fill deposition, as used herein, is a process where the conductive layer 140 is applied to fill the interconnect features (vias and trenches) and to coat the flat "field" regions between features leading to a conductive layer 140 covering the entire dielectric layer 120 and the barrier layer 130. Fill deposition typically results in a non-planar surface topography of the conductive layer 140 because of the variation of the size of the underlying dielectric layer 120 features being coated or filled.

Conductive layers 140 may generally comprise metals, metal alloys, conductive polymers, conductive composite materials, and any other suitable conductive materials. As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the $3d$, $4d$, $5d$, and $6d$ orbitals surrounding the nucleus of the element. As used herein, the phrase "f-block" means those elements that have electrons filling the $4f$ and $5f$ orbitals surrounding the nucleus of the element, including the lanthanides and the actinides. Preferred metals include titanium, silicon, cobalt, copper, nickel, iron, zinc, vanadium, aluminum, tin, chromium, platinum, palladium, gold, silver, tungsten, molybdenum, cerium, promethium, and thorium. More preferred metals include aluminum, titanium, silicon, copper, nickel, platinum, tin, gold, silver and tungsten. Most preferred metals include copper, aluminum and tungsten. The term "metal" also includes alloys, metal/metal composites, metal ceramic composites, metal polymer composites, as well as other metal composites.

The protective layer 150 is coupled to the conductive layer 140 by any suitable process, such as use of an adhesive, hydrogen bonding, electrostatic interactions, Van der Waals forces, and coulombic interactions.

The protective layer 150 is also generally contemplated to be a protective or passivating overlayer, which planarizes or can be planarized and that is coupled to the conductive layer 140 initially or at some stage of processing as a liquid, but may be converted into a harder or solid protective layer upon application of a curing process. The protective layer 150 can be deposited onto the conductive layer 140 by a variety of processes, including electroplating, spin-on deposition, evaporative deposition, electroless plating, sputtering/PVD, PECVD, CVD, and/or vacuum evaporation with or without a voltage bias.

The protective layer 150 can be composed of inorganic, organic, or organometallic compounds, metals and metal alloys as well as mixtures of these materials. Contemplated inorganic and organic compounds should be those compounds that are a) capable of being controllably etchable at the same time that the coupled conductive layer 140 is being etched, and b) planarizes on the conductive layer 140 before the etching step begins. Planarizing on the conductive layer 140 may comprise either a) a material that melts with a low viscosity and a high surface tension that can flow to form on the conductive layer 140 and/or b) can self-catalyze or self-cure to the desirable hardness on the conductive layer 140 after being applied to the conductive layer 140, or a fluid material that can be mechanically planarized. (See "Improved Apparatus and Methods for Integrated Circuit Planarization", Endisch, Levert et al.; contact planarization device and apparatus). Examples of contemplated inorganic compounds are silicates, aluminates, siloxane compounds, HOSP compounds, such as those that are commercially available from Honeywell International, Inc. or disclosed in commonly assigned U.S. Pat. Nos. 6,020,410, 6,043,330, 5,973,095 incorporated by reference herein in their entirety, Spin-on Glass compounds, such as Honeywell 512B, and compounds containing transition metals. Examples of organic compounds include polyarylene ether (FLARE materials), polyimides, Accuflow mixtures (Novalac Resins), acrylic polymers, polyvinyl acetates, PMMA, polyoctadecyl methacrylate, polyvinyl pyridine, Superglues (cyanoacrylates), PVB (polyvinyl buterol) and polyesters. Examples of contemplated organometallic compounds include poly(dimethylsiloxane), poly(vinylsiloxane) and poly(trifluoropropylsiloxane). Examples of contemplated metals and metal alloys include copper; liquid metals, such a mercury; lead free solder, tin, tin etchant (HCl+HNO$_3$), gallium and gallium alloys, and bismuth and bismuth alloys (including those with indium), indium and indium alloys.

The protective layer 150 may also include substantially polymeric material, substantially monomeric material or a mixture of both polymers and monomers depending on the desired viscous consistency, the desired final consistency if curing is applied to the protective layer, and the desired planarization and etch properties. It is further contemplated that the protective layer 150 may be composed of amorphous, cross-linked, crystalline, or branched polymers.

Contemplated polymers may also comprise a wide range of functional or structural moieties, including aromatic systems, and halogenated groups. Furthermore, appropriate polymers may have many configurations, including a homopolymer, and a heteropolymer. Moreover, alternative polymers may have various forms, such as linear, branched, super-branched, or three-dimensional. The molecular weight of contemplated polymers spans a wide range, typically between 400 Dalton and 400000 Dalton or more. In a preferred embodiment, the protective layer 150 comprises inorganic molecules or polymers. In a most preferred embodiment, the protective layer 150 comprises a polysilicate.

The protective layer 150 may additionally or alternately comprise monomers in order to meet certain design goals and/or structural requirements, such as those mentioned previously. Monomers may belong to various chemical classes of molecules including organometallic or inorganic molecules. Examples of contemplated organometallic monomers are octamethylcyclotetrasiloxane, methylphenylcyclotetrasiloxane, hexanethyldisilazane, and triethyoxysilane. Examples of contemplated inorganic monomers include tetraethoxysilane or aluminum isopropoxide. Monomers may also include additional groups, such as groups used for crosslinking.

In further alternative embodiments, many other silicon-containing materials are contemplated as components of the protective layer 150, including colloidal silica, fumed silica, siloxanes, silsequioxanes, and sol-gel-derived monosize silica. Appropriate silicon-containing compounds preferably have a size of below 100 nm, more preferably below 10 mn and most preferably below 5 nm. Preferred silicon-containing compounds include Honeywell spin-on glass materials, such as Honeywell 314 and Honeywell 512B.

The protective layer 150 may also comprise low temperature melting metals or metal alloys, preferably lead free, and will generate environmentally benign etching byproducts. A protective layer 150 comprising these metals or metal alloys must have a melting temperature below 400° C., which is considered the thermal budget of the wafer. Contemplated metals or metal alloys must not rapidly form alloys or intermetallic compounds with the existing conductive layer 140 onto which they have been deposited. An additional barrier layer can be deposited over the conductive copper layer, as part of the protective layer, to prevent liquid of solid-state diffusion of the overlayer metal into the conductive material. Nickel is an example of a material that has successfully prevented this type of diffusion into the conductive layer, which could damage the final electrical properties of the conductive layer.

An electronic component 10 can be produced by a) providing a substrate 110; b) coupling a dielectric layer 120 to the substrate 110; c) coupling a barrier layer 130 to the dielectric layer 120; d) coupling a conductive layer 140 to the barrier layer 130; and e) coupling a protective layer 150 to the conductive layer 140. The protective layer 150 may then be cured to a desirable hardness.

The barrier layer 130 can be deposited onto the dielectric layer, the conductive layer 140 can be deposited on the barrier layer 130 and the protective layer 150 can be deposited onto the conductive layer 140 by a variety of processes, including electroplating, spin-on deposition, evaporative deposition, electroless plating, sputtering/PVD, PECVD, CVD, and/or vacuum evaporation with or without a voltage bias.

The protective layer 150 can be cured either by a process external to the material in the protective layer 150 or may be cured by a process internal to the material in the protective layer 150. External processes include but are not limited to heat, radiation, air flow, pressure, and decrease in temperature. Internal processes are those processes that take place within the compound itself, such as crosslinking, chemical reactions between constituents that are not initiated by outside forces and other related processes.

A method of planarizing a conductive layer 150 of an electronic component 10 may comprise a) introducing or coupling a protective layer 140 onto a conductive layer 150; b) dispersing and planarizing the protective layer 150 across the conductive layer 140; c) curing the protective layer 150; d) introducing an etching solution 170 (not shown) onto the conductive layer 140; and e) etching the conductive layer 140 to substantial planarity.

Introducing or coupling the protective layer 150 onto the conductive layer 140 can be achieved by a variety of processes, including electroplating, spin-on deposition, evaporative deposition, electroless plating, sputtering/PVD, PECVD, CVD, and/or vacuum evaporation with or without a voltage bias. It is contemplated that the protective layer 150 will be introduced onto the conductive surface 140 in such quantities that preferential protection to depressed regions of the conductive surface 140 will be accomplished.

Dispersing the protective layer 150 across the conductive layer 140 is accomplished through relative motion of the electronic component 10. Relative motion is contemplated to mean spinning the component 10, shaking the component 10, rocking the component 10, or otherwise moving the component 10 around to disperse the protective layer 150.

Curing the protective layer 150 is contemplated to encompass the methods previously discussed herein, including external and internal curing processes. External processes include but are not limited to heat, radiation or irradiation, air flow, pressure, ashing (exposure to an oxygen or oxygen-mixture with nitrogen, hydrogen or forming gas plasma), a decrease in temperature or a combination of any of the above-mentioned curing processes. Internal processes are those processes that take place within the compound itself, such as crosslinking, chemical reactions between constituents that are not initiated by outside forces and other related processes.

Introducing the etching solution 170 (not shown) onto the conductive layer 140 may be accomplished by any suitable means, including spin-on deposition, random deposition, surface washing, dipping, dripping, and rolling the etching solution 170 onto the surface. Typical and contemplated etching solutions comprise one or more of the following: $HNO_3$, $H_3PO_4$, $CH_3COOH$, HCl, chlorides of copper and zinc, HBr, $H_2SO_4$ and HF. Preferred etching solutions comprise: a) 69 weight % (wt %)//10 volume % (vol %) $HNO_3$, 85 wt %/50 vol % $H_3PO_4$, and 98 wt %/40 vol % $CH_3COOH$; b) 69 weight % (wt %)/6 volume % (vol %) $HNO_3$, 85 wt %/70 vol % $H_3PO_4$, and 98 wt %/24 vol % $CH_3COOH$; 69 weight % (wt %)/1.6 volume % (vol %) $HNO_3$, 85 wt %/53.9 vol % $H_3PO_4$, and 98 wt %/43.2 vol % $CH_3COOH$; 49 wt %/1.3 vol % HF.

As used herein, the phrase "substantial planarity" generally means that degree of planarity that is considered to be acceptable for the contemplated or desired electronic component. Substantial planarity is considered herein to be a degree of planarity of at least 0.6 or 60% or achieving perfect planarity. In preferred embodiments, substantial planarity is considered to be a degree of planarity of at least 0.8 or 80%. And in more preferred embodiments, substantial planarity is considered to be a degree of planarity of at least 0.9 or 90%. Analytical Test Methods: Planarization was measured by KLA-Tencor HRP-220 mechanical stylus profilometer.

EXAMPLES

Example 1

Planarizer Material/Protective Layer Deposition

A 1000 Angstrom thick nickel barrier layer is deposited on a copper substrate/conductive layer by vacuum evaporation. A planarizer material/protective layer comprising 66.3 wt % Indium and 33.7 wt % of Bismuth as a eutectic alloy is deposited on the barrier layer by vacuum evaporation to a thickness of 1.5 $\mu$m. Both the nickel barrier layer and indium bismuth protective layer are deposited by using a vacuum evaporative deposition tool to form a wafer. This deposition tool uses electron beam evaporation of any elemental or alloy metal allowing deposition under a vacuum atmosphere. The copper substrate/conductive layer surface was precleaned with an argon sputter using a voltage bias before the nickel barrier layer and the indium bismuth protective layer were deposited. Both the nickel barrier layer and the indium bismuth protective layer were deposited without "breaking" or turning off the vacuum after precleaning.

The barrier layer and the conductive layer discussed above may also be deposited also by electroplating and electroless plating, which are both economical methods. Electroplating is a simple scale-up from existing copper plating technology used today by the integrated circuits industry. Lead free solder materials, similar to the ones used herein, are generally developed by using electroplating or electroless plating options for the electronics packaging industries to eliminate toxic lead from the solder. Tin Copper and Indium Tin alloys were also successfully deposited with these methods.

Planarizer/Protective Layer Reflow Process

Figure 7:
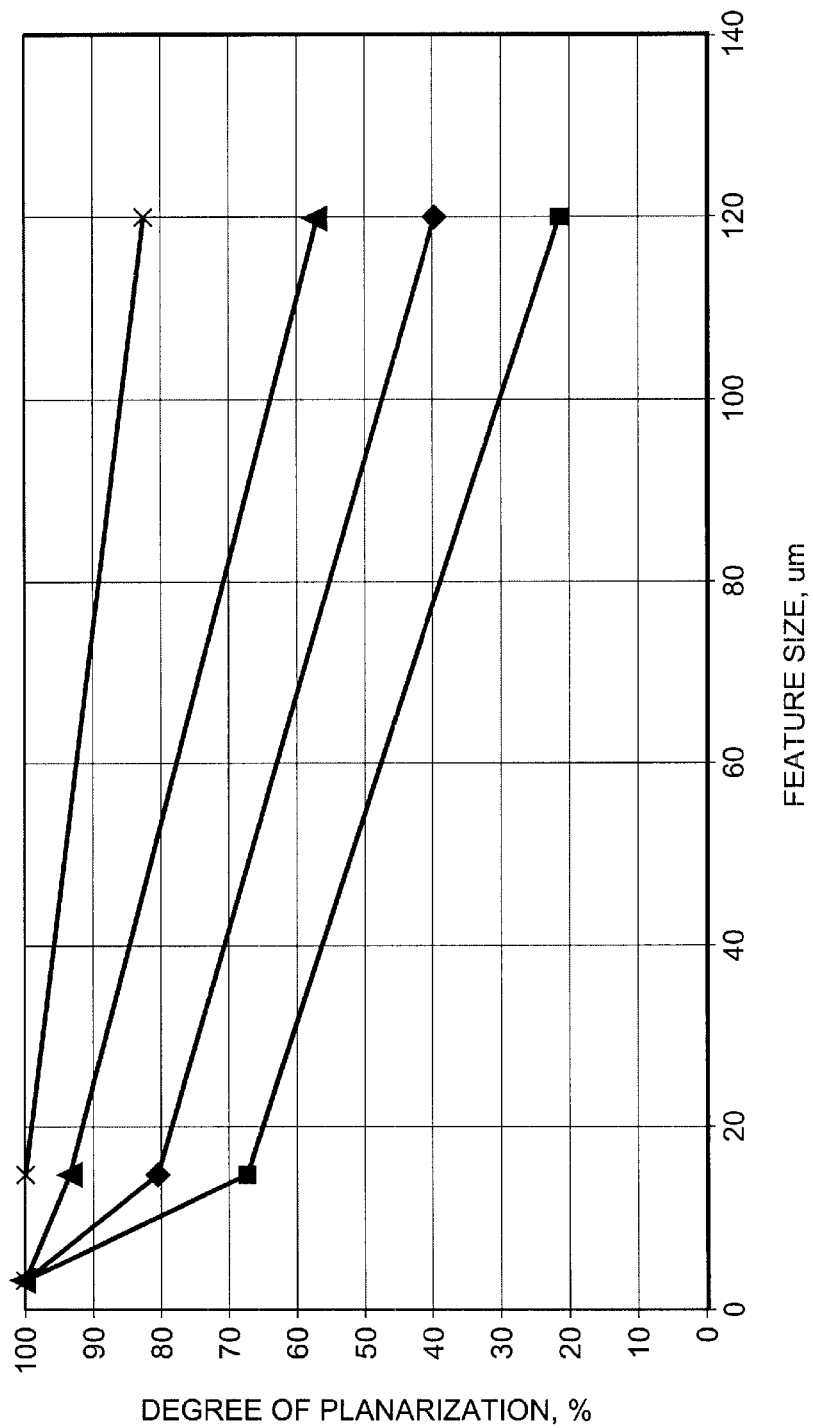
FIG. 7 is a graph showing the Degree of Planarization versus the Feature Size in micrometers.

The wafer containing the barrier layer and the protective layer was predipped in 85 wt % $H_3PO_4$ and rinsed with deionized (DI) water to remove oxidized surface material. The wafer is then rapidly heated on a hotplate with an approximate temperature of 280° C., which is well above the 75° C. indium bismuth melting point, but well below the nickel or copper melting point or the allowable 400° C. that the wafer substrate can withstand without damage to the pre-existing electrical materials/structures. The wafer was heated until the indium bismuth melted (less than 2 seconds) and then the wafer was rapidly cooled. The final structure allowed surface planarization of even very large features or surface defects, i.e. those greater than 100 $\mu$m across for 0.5$\mu$, deep features. The final indium bismuth planarization was measured using a KLA-Tencor HRP-220 mechanical stylus profilometer. The planarization results are summarized in FIG. 7. Note that DoP is an abbreviation for "degree of planarization" where 1.0 is perfect planarization of a trench feature and 0.0 is no planarization. In situ reflow within the above-mentioned vacuum chamber will give improved results over conventional methods with fewer surface defects or features. Also, immediate reflow of the indium bismuth after electroplating or electroless plating deposition will give improves results over conventional methods with fewer surface defects or features.

Sacrificial Etchback of InBi to Planarize Copper Substrate/Conductive Layer

Copper, nickel and indium/bismuth pieces were etched in beakers using the following etchant combinations:

A: 4 vol % $HNO_3$ (70 wt %); 80 vol % $H_3PO_4$ (86 wt %); 16 vol % HBr (49 wt %)

B: 5 vol % $HNO_3$ (70 wt %); 79 vol % $H_3PO_4$ (86 wt %); 16 vol % HCl (37 wt %)

The etch rate results (Angstroms/min) for individual metal films are as follows for each type of etchant mix as listed above:

A: Cu=2000; Ni=1500; InBi=4200

B: Cu=2300; Ni=1800; InBi=5700

By running the etch rate tests on full-sized wafers in the tool, the across-wafer non-uniformity will be less than 5% 3-sigma for all metals. Also, by using a spin etch process on the indium/bismuth planarized wafers, the planar indium/bismuth surface will be uniformly etched at an equal rate as both the nickel and copper substrate leaving a final copper surface that is planar. Once the copper surface is planar and all sacrificial nickel and indium/bismuth is gone, then Mix A can be used to finish copper removal and polishing until stopping in the Ta on the field.

Example 2

A composition for a protective layer comprises the following components: colloidal copper oxide, copper hydrogen phosphate salts, copper acetate, copper nitrate and/or colloidal copper; and a polymeric solution of high viscosity having gelling/solidification properties suitable for functioning as the protective layer defined herein, to be used as the binder or matrix phase of the protective layer. The polymeric binder composition is an aqueous solution of high molecular weight polyethylene, polyvinyl alcohol, polyvinylpyrrolidone of such polymeric solutions doped with a solution of colloidal silica or boehmite to facilitate the formation of a rigid gel at a suitable temperature (preferably near room temperature) in the course of time and also to reduce the etch rate of the coatings to achieve nearly 1:1 selectivity with copper etching.

If the resulting etch rate of the spin-on layer, when using the standard etch solution, is greater than that of copper, the etching behavior of the standard etch solution can be altered by adding a polyethylene glycol or high molecular weight polyethylene oxide (when using a polyethylene-based protective layer). Such additives tend to lower the etch rate of the spin-on protective layer but do not change the copper etch rate, permitting an etch selectivity of 1:1 to be achieved.

In addition, the presence of phosphate-containing groups in a copper phosphate protective layer will likewise contribute to a reduction in the etch rate, when etching with etchants containing phosphoric acid.

The presence of copper salts, such as copper hydrogen phosphate, can reduce the dissolution of copper at the copper interface as the etching solution produces this type of insoluble copper phosphate. Thus, saturation of copper-containing compound at the interface will act as a chemical inhibiting layer.

Example 3

Planarizer Material/Protective Layer Deposition

A planarizer material/protective layer comprising an Accuflow material (Novalac Resin) is deposited on the conductive layer by spin track dispense. Immediately following the application of the Accuflow, the spin speed of the chuck is ramped up to create a uniform layer of Accuflow of a thickness of 1.5 um. This ramping and subsequent hot plate bakes drive off the solvent dispensed with the Accuflow as well as partially reflow the protective layer.

Planarizer/Protective Layer Cure, Reflow, and Etchback Process

The wafer containing the protective layer was cured in a furnace to drive off all remaining solvents and to complete the reflow of the Accuflow at a temperature of 350° C., well below the copper melting point or the allowable 400 C. that the wafer substrate can withstand without damage to the pre-existing electrical materials/structures. The final structure allowed surface planarization of even very large features or surface defects, i.e. those greater than 100 $\mu$m across for 0.5$\mu$, deep features. The final Accuflow planarization was measured using a KLA-Tencor HRP-220 mechanical stylus profilometer. Once cured the Accuflow and conductor can be etched with 1:1 selectivity maintaining planarity of the surface.

Once the copper surface is planar and all sacrificial Accuflow material is gone, then Mix A can be used to finish copper removal and polishing until stopping in the Ta on the field.

Example 4

Planarizer Material/Protective Layer Deposition

A planarizer material/protective layer comprising Honeywell 512B (spin on glass material) is deposited on the conductive layer by spin track dispense. Immediately following the application of the Honeywell 512B, the spin speed of the chuck is ramped up to create a uniform layer of 512B of a thickness of 1.0 um. This ramping and subsequent hot plate bakes drive off the solvent dispensed with the 512B as well as partially reflow the protective layer.

Planarizer/Protective Layer Cure, Reflow, and Etchback Process

The wafer containing the protective layer was cured in a furnace to drive off all remaining solvents and to complete the reflow of the 512B at a temperature of 350° C., well below the copper melting point or the allowable 400° C. that the wafer substrate can withstand without damage to the pre-existing electrical materials/structures. The final structure allowed surface planarization of even very large features or surface defects, i.e. those greater than 100 $\mu$m across for 0.5$\mu$, deep features. The final Honeywell 512B planarization was measured using a KLA-Tencor HRP-220 mechanical stylus profilometer. Once cured the 512B and conductor can be etched with 1:1 selectivity maintaining planarity of the surface.

Once the copper surface is planar and all sacrificial Honeywell 512B is gone, then Mix A can be used to finish copper removal and polishing until stopping in the Ta on the field.

Example 5

Gallium, gallium indium, gallium alloys, and indium alloys (with near room temperature melting points), were successfully evaporatively deposited onto bare, blanket copper, patterned copper and blanket Ta coated silicon wafers. Profilometry indicated that the deposition planarized the small features on the pattern wafer.

The melted material can be spun onto the wafer using standard spin tools. The wafer will stand for a few seconds to allow the molten metal flow fill recesses and thereby planarize the wafer. Then the wafer is chilled to slightly below sub-ambient temperature (less than 20° C.) to solidify the metal planarizer. A warm solution or warm water can be used along with many common etchants (nitric acid) to remove the metal planarizer at a 1:1 selectivity with the copper from the wafer which has its sub-ambient temperature maintained by the surrounding instrumentation. The copper will require an active acid or base for its removal while a warm liquid—even warm water could be used for the metal planarizer removal while an acid (which does not attack the metal planarizer) could be used in the etching solution to remove the copper.

Example 6

The salt-like or molten salt Planarizers, such as $BiONO_3$, $B_{10}H_{14}$, $B(OH)_3$, $HBO_2$—alpha, beta or gamma, copper acetate, copper nitrate, $FeCl_3$, $LiClO_4$, $Mg(OH)_2$, $Mn(C_2H_3O_2)*4H_2O$, $KNO_3$, $Ag_2CO_3$, $SO_2(NH_2)_2$, $SNCl_2$, and $Zn(OH)_2$, are applied as a powder or spun on as a slurry to control thickness. The wafer is then heated in a controlled atmosphere (vacuum or inert gas) to melt the salt without damaging the existing patterned copper damascene features. The melted salt can then flow into the recessed areas, in a similar manner to the molten metals/metal planarizers listed above, thereby planarizing patterned copper features. The wafer is then cooled to re-solidify the salts into a planar film on top of the pattered copper. The etchant is then formulated to remove the copper and at the same time have the proper water and/or acid composition to remove the salt at a substantially 1:1 rate with the copper.

Thus, specific embodiments and applications of spin on planarizers and methods of production of spin on planarizers and methods of planarizing have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. An electronic component, comprising:
   a substrate layer;
   a dielectric material coupled to the substrate layer;
   a barrier layer coupled to the dielectric material;
   a conductive layer coupled to the barrier layer; and
   a protective layer coupled to the conductive layer, wherein the protective layer comprises at least one metal, at least one salt-like material, at least one organic spin-on polymer material or at least one metal alloy.

2. The electronic component of claim 1, wherein the dielectric material is porous and has a dielectric constant less than 3.0.

3. The electronic component of claim 1, wherein the barrier layer comprises tantalum, tantalum nitride, a stacked tantalum/tantalum nitride sandwich, or tungsten nitride (WN).

4. The electronic component of claim 1, wherein the conductive layer comprises a transition metal.

5. The electronic component of claim 4, wherein the transition metal is copper.

6. The electronic component of claim 1, wherein the protective layer comprises a viscous material.

7. The electronic component of claim 6, wherein the viscous material hardens when a curing process is applied to the viscous material.

8. The electronic component of claim 1, wherein the protective layer does not etch the conductive layer.

9. The electronic component of claim 1, wherein the at least one metal or the at least one metal alloy comprise copper.

10. The electronic component of claim 1, wherein the at least one metal or the at least one metal alloy comprise nickel.

11. The electronic component of claim 1, wherein the at least one metal or the at least one metal alloy comprise indium.

* * * * *